United States Patent
Joung et al.

(10) Patent No.: US 8,787,513 B2
(45) Date of Patent: Jul. 22, 2014

(54) DIGITAL RE-SAMPLING APPARATUS USING FRACTIONAL DELAY GENERATOR

(75) Inventors: Jinsoup Joung, Seongnam-si (KR); Kyeongmin Ha, Seongnam-si (KR); Joohyeong Lee, Seoul (KR)

(73) Assignee: Innowireless Co., Ltd. (KR)

( * ) Notice: Subject to any disclaimer, the term of this patent is extended or adjusted under 35 U.S.C. 154(b) by 0 days.

(21) Appl. No.: 13/816,255

(22) PCT Filed: Dec. 30, 2010

(86) PCT No.: PCT/KR2010/009582
§ 371 (c)(1),
(2), (4) Date: Feb. 11, 2013

(87) PCT Pub. No.: WO2012/050267
PCT Pub. Date: Apr. 19, 2012

(65) Prior Publication Data
US 2013/0187694 A1 Jul. 25, 2013

(30) Foreign Application Priority Data
Oct. 14, 2010 (KR) ........................ 10-2010-0100156

(51) Int. Cl.
*H04L 7/00* (2006.01)
*H03H 17/06* (2006.01)
*H03H 17/04* (2006.01)
*H03H 17/00* (2006.01)

(52) U.S. Cl.
CPC ....... *H03H 17/0444* (2013.01); *H03H 17/0642* (2013.01); *H03H 17/0027* (2013.01)
USPC ............................ 375/355; 375/359; 375/343

(58) Field of Classification Search
USPC ................................. 375/359, 343
See application file for complete search history.

(56) References Cited

U.S. PATENT DOCUMENTS

| 7,542,536 B2 * | 6/2009 | Barnette et al. ............... 375/355 |
| 2006/0256849 A1 * | 11/2006 | Tseng et al. ................... 375/232 |

FOREIGN PATENT DOCUMENTS

| JP | 200183829 | 6/2000 |
| JP | 2009094762 | 4/2009 |
| KR | 1020060098737 | 9/2006 |
| KR | 1020070051326 | 5/2007 |
| KR | 1020080049762 | 6/2008 |

OTHER PUBLICATIONS

International Search Report—PCT/KR2010/009582 dated Nov. 23, 2011.
J. Y. Kim, et al, Arbitrary scaling of images using an M-channel DFT filter bank with optimized adaptive interpolation kernels, IEICE Electronics Express, Nov. 2007, vol. 4, No. 21 pp. 665-671.
J. Y. Kim, et al., Design of a new DFT filter bank with modified sampling kernels and its application to arbitrary image scaling, IEICE Electronics Express, Jan. 2009, vol. 6, No. 2, pp. 58-64.

* cited by examiner

*Primary Examiner* — Kabir A Timory
(74) *Attorney, Agent, or Firm* — Cantor Colburn LLP

(57) ABSTRACT

Disclosed herein is a digital re-sampling apparatus. The digital re-sampling apparatus includes a sample buffer, a sample buffer control unit, a filter bank, a first delay bank, a fractional delay constant table, a combiner bank, and a second delay bank. The sample buffer temporarily stores an input sample in synchronization with an input sampling frequency. The sample buffer control unit controls writing and reading operations. The filter bank includes a number of digital filters equal to the number of stages, and filters the input sample. The first delay bank differentially delays a filter output value. The fractional delay constant table stores information about re-sampling time. The combiner bank includes a number of adders and multipliers, performs an operation, and outputs a re-sampled value. The second delay bank causes a delay so that output of each combiner can be synchronized with each output of the fractional delay constant table.

15 Claims, 3 Drawing Sheets

DIGITAL RE-SAMPLING APPARATUS USING FRACTIONAL DELAY GENERATOR

TECHNICAL FIELD

The present invention relates to a digital re-sampling apparatus using a fractional delay generator, and, more particularly, to a digital re-sampling apparatus using a fractional delay generator, in which a sample generation circuit for generating samples having an arbitrary sampling frequency different than that of the real-time input samples is efficiently optimized through the interpolation using digital filters and fractional delays.

BACKGROUND ART

With the development of communication technology, communication systems based on a variety of standards are being created, and respective communication technologies are using different sampling frequencies according to the usable frequency band and the modulation scheme. Digital signal processing which is performed between heterogeneous systems having different sampling frequencies can be easily implemented by conversion between sampling frequencies. In general, conversion between sampling frequencies is performed using a D/A (digital to analog) converter and then an A/D (analog to digital) converter, in which case the quality of a target signal is deteriorated by the introduction of an analog circuit and the influence of noise.

In light of these problems, a method of converting a sampling frequency in a digital domain was proposed. FIG. 1 is a diagram illustrating a conventional method of converting a sampling frequency in a digital domain. As shown in FIG. 1, according to the conventional method of converting a sampling frequency in a digital domain, for example, when the conversion of a sampling frequency of 122.88 MHz into a sampling frequency of 20 MHz is desired, an output sampling frequency of 20 MHz is obtained by performing multiplication and division on an input sampling frequency (in the example of FIG. 1, a total of 12 frequency multiplication and division calculations) using a prime number until a target output sampling frequency is reached. Therefore, the number of clock frequencies used in a system increases accordingly, so that a problem arises in that a circuit is complicated.

FIG. 2 is a block diagram showing a conventional interpolator for estimating a sample value at a specific time between two samples using a digital filter, and FIG. 3 is a block diagram showing the digital filter of FIG. 2. FIG. 3 shows an interpolator using an 8-tap, 3rd-order digital filter as an example. As shown in FIG. 3, the conventional interpolator chiefly uses a Finite Impulse Response (FIR) filter as the digital filter. Such a conventional FIR filter includes a multi-tap delay line which sequentially outputs an input sample to a subsequent tap every input clock cycle. The output sample of each tap is multiplied by a predetermined filter coefficient, resulting values are added to each other, and the sum is output as a filter output value.

Meanwhile, since the order of the interpolator shown in FIG. 3 is 3, the total number of stages of individual filters is 4. Operations are performed on the filter output value of each stage and a predetermined delay parameter using a combiner including the combination of a multiplier and an adder, and finally an interpolated sample value at a desired time between two samples can be obtained.

The following Equation 1 is used to obtain the filter output value of each stage and an interpolated sample value.

$$y_m = \sum_n x_n c_{n,m} \quad z(\alpha) = \sum_m \alpha^m y_m \tag{1}$$

In the above Equation 1, m is the order of filters, that is, the number of stages, and n is the number of taps of each filter. $x_n$ is an input sample, $y_m$ is the filter output value of each stage, and $c_n$ is a filter coefficient. $\alpha$ is a delay parameter, and $z(\alpha)$ is an interpolated sample value.

The following Table 1 is an example of a filter coefficient table.

TABLE 1

| | c(n, m) | | | |
| --- | --- | --- | --- | --- |
| | m | | | |
| | 0 | 1 | 2 | 3 |
| 0 | −0.013824 | 0.003143 | 0.055298 | −0.012573 |
| 1 | 0.054062 | −0.019287 | −0.216248 | 0.077148 |
| 2 | −0.157959 | 0.100800 | 0.631836 | −0.403198 |
| 3 | 0.516394 | −1.226364 | −0.465576 | 0.905457 |
| 4 | 0.516394 | 1.226364 | −0.465576 | −0.905457 |
| 5 | −0.157959 | −0.100800 | 0.631836 | 0.403198 |
| 6 | 0.054062 | 0.019287 | −0.216248 | −0.077148 |
| 7 | −0.013824 | −0.003143 | 0.055298 | 0.012573 |

In the above Table 1, the column indicates filter stage numbers, and the row indicates the tap numbers of the filters. The values may be appropriately adjusted.

However, the above-described conventional interpolator-related technology proposes merely the principle based on which an interpolated sample value at a specific time between two samples is obtained in a software manner, but does not disclose a technology that is used to implement a re-sampling apparatus for converting a sample, input at an input sampling frequency in real time, into a sample having a different sampling frequency, that is, up sampling or down sampling, and then outputting the sample.

DISCLOSURE OF INVENTION

Technical Problem

Accordingly, the present invention has been made keeping in mind the above problems occurring in the prior art, and an object of the present invention is to provide a digital re-sampling apparatus using a fractional delay generator, in which a circuit for converting samples, input at an input sampling frequency in real time, into samples having a different sampling frequency by means of interpolation using a digital filter and a fractional delay and outputting them is optimized and efficiently implemented.

Solution to Problem

In order to accomplish the above object, the present invention provides a digital re-sampling apparatus using a fractional delay generator, including a sample buffer for temporarily storing an input sample in synchronization with an input sampling frequency; a sample buffer control unit for controlling writing and reading operations of the sample buffer; a filter bank for digital filtering of the input samples, and comprising multiple digital filters composed of multiple taps, as many as the number of the stages in the filter bank; a first delay bank for differentially delaying the outputs of the filters in the filter bank based on the corresponding number of the stages; a fractional delay constant table for storing information on time for re-sampling of the input samples; a combiner bank for generating a re-sampled output for every re-sampling time through arithmetic operations performed with the output of the first delay bank and the fractional delay constant stored in the fractional delay constant table, and comprising combiners composed of combinations of adders and multipliers, as many as the number of the stages; and a second delay bank for delaying the outputs of the combiners in synchronization with the outputs of the fractional delay constant table so as to obtain sequential high-speed operation of the combiners in the combiner bank.

The filter bank, the first delay bank, the combiner bank and the second delay bank may operate in synchronization with a system frequency that may be higher than the output sampling frequency.

The digital re-sampling apparatus may further include an output valid signal generator for providing information about a valid sample when the system frequency is higher than the output sampling frequency.

The fractional delay constant table may include a ring buffer for storing fractional delay constants and sample interval information, each of fractional delay constants may be determined by a ratio of the input sampling frequency to the output sampling frequency and is a decimal greater than or equal to 0 and less than 1, and the sample interval information may indicate information about the address of the sample buffer where a sample to be subsequently inputted to the filter bank has been stored.

The fractional delay constant table may include at least two fractional delay constant tables, and a multiplexer for selecting one fractional delay constant table from among the two fractional delay constant tables may be further included.

The buffer control unit may include a reading control unit, a rate tracking & sync detection unit, and a writing control unit, the writing control unit may create a write address and a write enable signal related to the sample buffer, when a preset number of samples are inputted to the sample buffer, create a corresponding synchronization signal and then transfer the synchronization signal to the rate tracking & sync detection unit, and, whenever a preset number of samples are inputted, creates an 'increase by one' signal and then transfers the 'increase by one' signal to the rate tracking & sync detection unit, the rate tracking & sync detection unit may convert the synchronization signal created by the writing control unit into a trigger signal in a system frequency domain and then transfer the resulting signal to the reading control unit, receive address counter values related to the sample buffer from the reading control unit and the writing control unit, determine whether overflow or underflow has occurred and then provide determination results to an external processor so that the overflow or underflow can be compensated for, and the reading control unit may start to create a read address related to the sample buffer using the trigger signal received from the rate tracking & sync detection unit, receive the sample interval information N from the fractional delay constant table, change the read address of the sample buffer and then create a read enable signal related to the sample buffer, and, whenever L number of samples are read, creates a 'decrease by one' signal and then transfers the 'decrease by one' signal to the rate tracking & sync detection unit.

When the input sampling frequency is identical to the system frequency, the sample buffer, the reading control unit and the writing control unit may be omitted.

Advantageous Effects of Invention

In accordance with the digital re-sampling apparatus using a fractional delay generator according to the present invention, samples which are input at an input sampling frequency in real time can be re-sampled into samples having a different sampling frequency and then output in real time by means of interpolation using a digital filter and a fractional delay.

Furthermore, all fractional delay-related operations can be synchronized with a system frequency different from an output sampling frequency, so that a desired output sampling frequency can be freely determined, and so that the total number of clocks used in a system can be reduced, thereby simplifying the complexity of a circuit.

Moreover, a fractional delay constant table can be implemented in the form of a ring buffer by configuring the fractional delay constant table so that it includes a ring buffer, fractional delay constants and sample interval information, thereby considerably reducing the amount of memory which stores the fractional delay constant table.

BRIEF DESCRIPTION OF DRAWINGS

The above and other objects, features and advantages of the present invention will be more clearly understood from the following detailed description taken in conjunction with the accompanying drawings, in which.

MODE FOR THE INVENTION

A digital re-sampling apparatus using a fractional delay generator according to a preferred embodiment of the present invention will be described in detail below with reference to the accompanying drawings.

Figure 4:
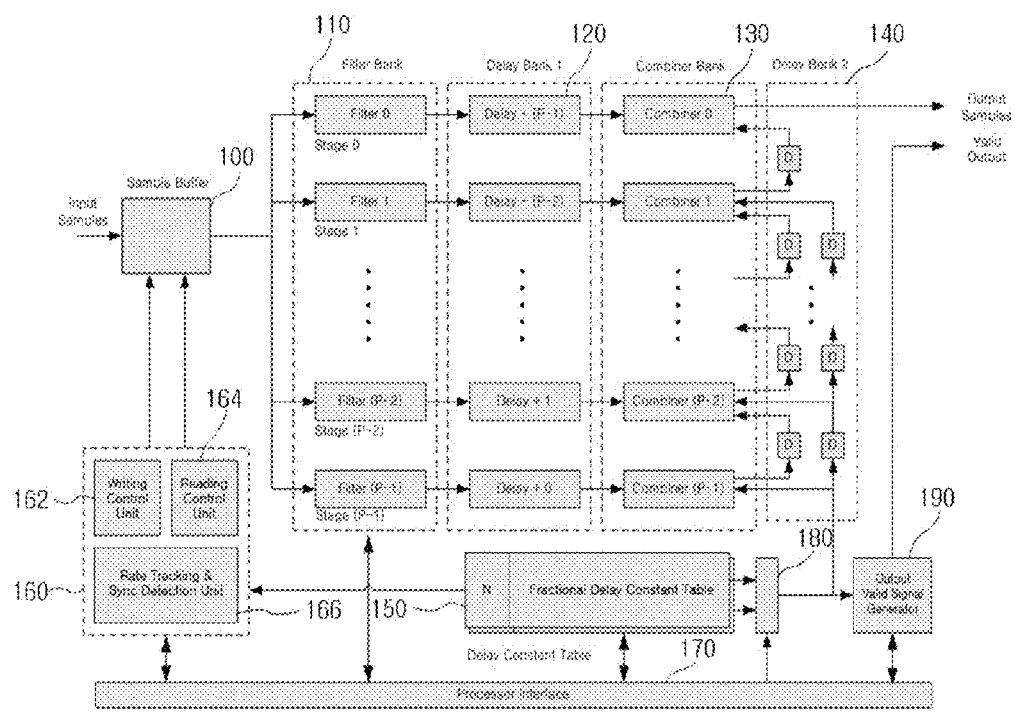
FIG. 4 is a block diagram of a digital re-sampling apparatus using a fractional delay generator according to the present invention.
Figure 5:
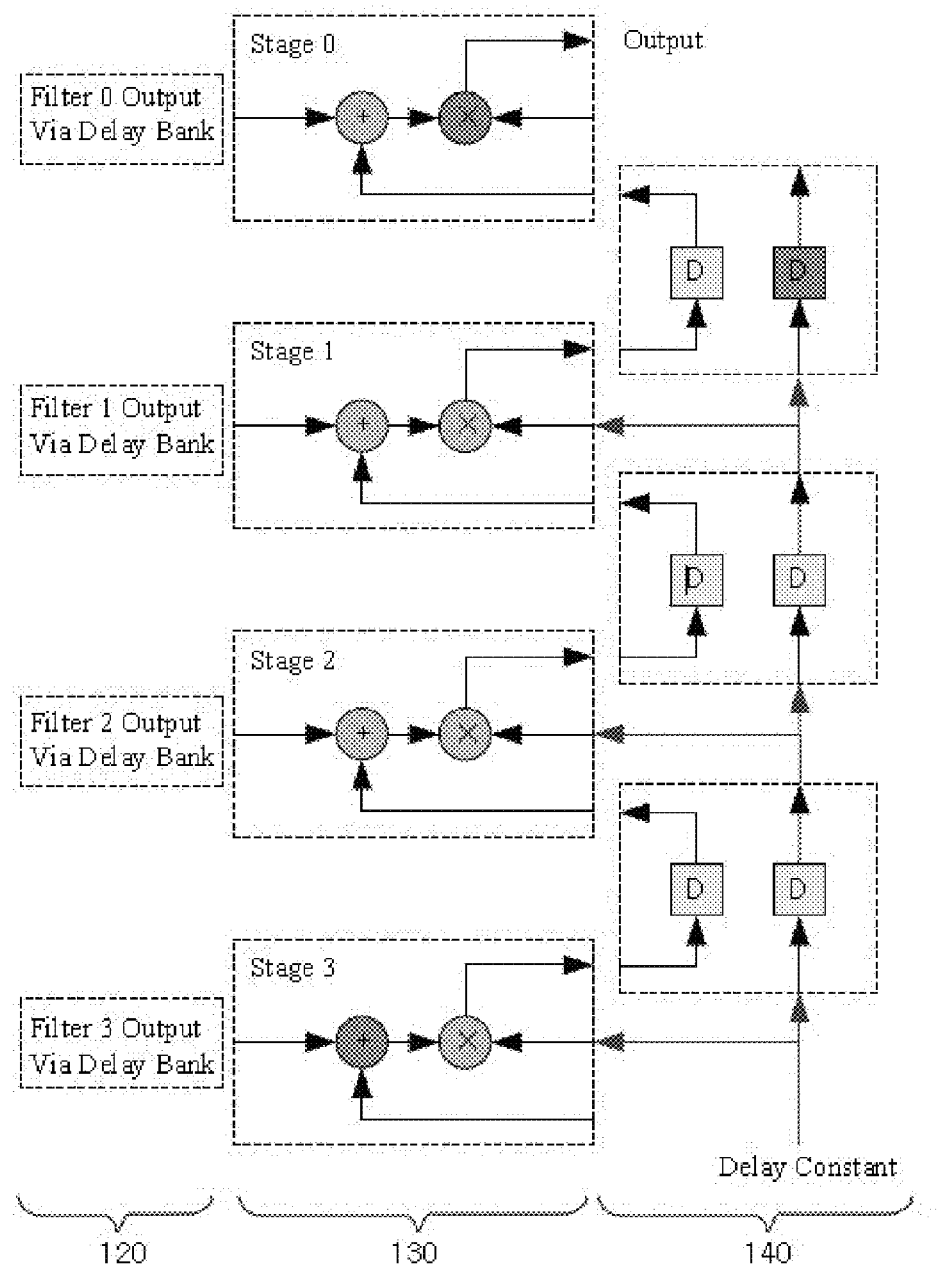
FIG. 5 is a detailed block diagram of the combiner and the rear delay shown in FIG. 4.

FIG. 4 is a block diagram of a digital re-sampling apparatus using a fractional delay generator according to the present invention, and FIG. 5 is a detailed block diagram of the combiner and the rear delay shown in FIG. 4.

As shown in FIG. 4, the digital re-sampling apparatus using a fractional delay generator according to the present invention includes a sample buffer 100 for temporarily storing a sample input in real time in synchronization with an input sampling frequency, a filter bank 110 configured to include a number of digital filters, including a plurality of taps, equal to the number of stages, and configured to filter the input sample, output from the sample buffer 100, in a digital manner, a first delay bank 120 for differentially delaying a filter output value, output from each filter of the filter bank 110, according to the number of stages of the filters, a fractional delay constant table 150 for storing information about a time at which the initial input sample will be re-sampled (that, up sampled or down sampled) based on a time at which the input sample was input, a combiner bank 130 configured to include the combination of a number of adders and multipliers equal to the number of stages of the filters, and configured to perform an operation on an output of the first delay bank and each of the fractional delay constants stored in the fractional delay constant table and output a re-sampled value whenever re-sampling is performed, and a second delay bank 140 for causing a delay so that output of each combiner can be synchronized with each output of the fractional delay constant table so as to support sequential fast operations of each combiner of the combiner bank.

Figure 1:
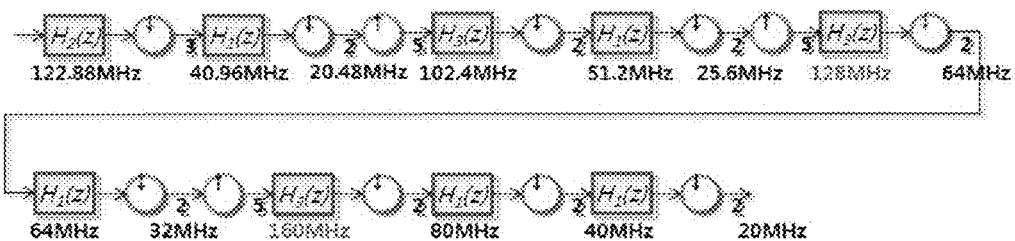
FIG. 1 is a diagram illustrating a conventional method of converting a sampling frequency in a digital domain.
Figure 2:
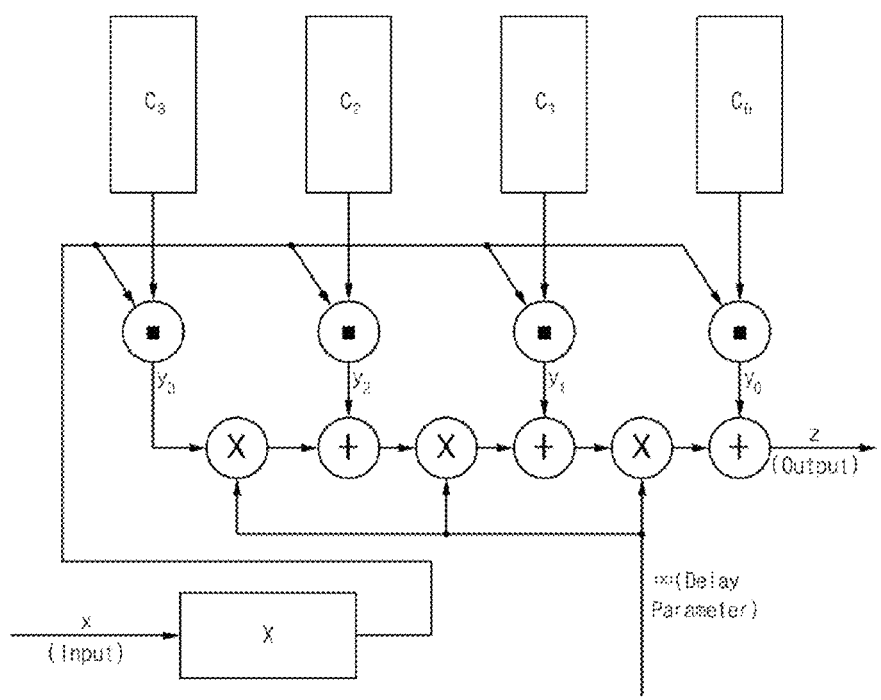
FIG. 2 is a block diagram showing a conventional interpolator for estimating a sample value at a specific time between two samples using a digital filter.
Figure 3:
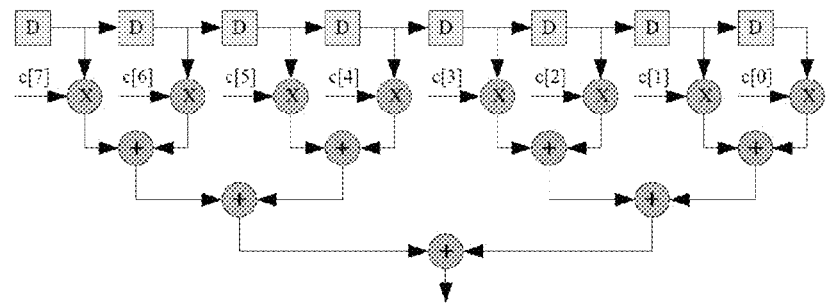
FIG. 3 is a block diagram showing the digital filter of FIG. 2.

In the above configuration, the filter bank 110 may be implemented using, for example, 8-tap, 4-stage digital filters. More precise re-sampling can be achieved in proportion to the numbers of taps and stages. Since the filter bank 110 is already well known, as shown in FIG. 2, a further detailed description thereof is omitted here. For the sake of convenience, the filter coefficient table was omitted from FIG. 4. Furthermore, since respective combiners of the combiner bank 130 shown in FIGS. 4 and 5 were also shown in FIG. 3, a further detailed description thereof will be omitted here.

Meanwhile, the re-sampling apparatus of the present invention employs a system clock frequency (hereinafter simply referred to as 'system frequency') which is a frequency different from the output sampling frequency so that a user can set the output sampling frequency as desired. Such a system frequency should be equal to or higher than the output sampling frequency. Accordingly, the input sample is stored in the sample buffer 100 in synchronization with the input sampling frequency, and is input to each filter of the filter bank 110 in synchronization with the system frequency, and a resulting re-sampled value is output from the highest combiner in synchronization with the system frequency.

Thereafter, in the combiners of the combiner bank 130, addition and multiplication operations are performed in multiple steps. Since the re-sampled output sample is output in synchronization with the system frequency, a signal delay method used at the input terminal of the combiner bank 130 is an important factor. In the present invention, the first delay bank 120 is disposed behind the filter bank 110 as a delay element. The first delay bank 120 is configured in such a way that one delay element is connected to the output of the lowest filter (stage P-1), two delay elements are connected to the output of the second-lowest filter (stage P-2), three delay elements are connected to the output of the third-lowest filter (stage P-3) and P delay elements are connected to the output of the highest filter (stage 0) so that the difference in the number of delay elements between neighboring filter outputs becomes one clock of the system frequency. Here, P denotes the number of filters which constitute the filter bank 110. In the present embodiment, P=4, so that the output of the highest filter (stage 0) is delayed by the three clocks of the system frequency, and is then input to the highest combiner (combiner 0) of the combiner bank 130.

Next, the second delay bank 140 is disposed behind the combiner bank 130. The second delay bank 140 is configured in such a way that one delay element is connected to the output of each combiner and one delay element is also connected to a fractional delay constant which will be multiplied by the multiplier of the combiner whenever the combiner is passed through.

Meanwhile, a re-sampled sample is output in synchronization with the system frequency. Due to the difference between the system frequency and the output sampling frequency, an output sample should be selected and used. In FIG. 4, reference numeral 190 denotes an output valid signal generator which provides information about the effective one of output samples so that a valid output sample can be selected and used. When a signal indicating information about a valid sample is created in accordance with the system frequency and output in association with a re-sampled sample, a receiving end (not shown) receives and buffers these and creates and uses a continuous sample in synchronization with the output sampling frequency. Of course, when the output sampling frequency and the system frequency are the same, a re-sampled sample is output every clock of the system frequency, so that the output valid signal generator 190 may be eliminated.

Next, fractional delay constants F each of which contains information about the time at which an initial input sample will be re-sampled, that is, up-sampled or down-sampled, based on the time at which the initial input sample was input are previously stored in the fractional delay constant table 150 by an external processor. Such a fractional delay constant F is determined depending on the ratio between the input sampling frequency $Fs\_i$ and the output sampling frequency $Fs\_o$, which will be described later. A fractional delay constant F is formed of a decimal which is greater than or equal 0 and less than 1.

Here, in order to reduce the amount of memory for storing the fractional delay constant table 150, the fractional delay constant table 150 is configured in the form of a ring buffer and sample interval information N indicting the interval to a sample to be used in a subsequently period, that is, a sample to be input to the filter bank 110, is stored together. The sample interval information N is a non-negative integer, and is a basic element used to control the operation of reading data from the sample buffer 100.

The following Table 2 is a fractional delay constant table for the case where, for example, the input sampling frequency is 50 MHz and the output sampling frequency is 200 MHz.

TABLE 2

| Sample interval information(N) | Fractional delay constant(F) |
|---|---|
| 0 | 0 |
| 0 | 0.25 |
| 0 | 0.5 |
| 1 | 0.75 |

In contrast, in the case where the input sampling frequency is 50 MHz and the output sampling frequency is 40 MHz, the fractional delay constant table 150 may be implemented like the following Table 3.

TABLE 3

| Sample interval information(N) | Fractional delay constant(F) |
|---|---|
| 1 | 0 |
| 1 | 0.25 |
| 1 | 0.5 |
| 2 | 0.75 |

In the above Tables 2 and 3, a current sample is used in a subsequent period when the sample interval information N is 0, and an N-th sample relative to the current sample is used when the sample interval information N is not 0. In connection with this, the read address of a reading control unit 164 is increased by N and created, and the address denotes a sample at an N-th address relative to a current address. That is, the next address which will be used by the reading control unit 164 (which will be described later) is the current address+N. Consequently, the amount of memory can be considerably reduced by configuring the fractional delay constant table in the form of a ring buffer. Using the configuration, the fractional delay constants F stored in the fractional delay constant table 150 in synchronization with the system frequency are sequentially output, and are multiplied by the multiplier of each combiner of the combiner bank 140. After the last fractional delay constant has been output, a return to the initial constant is performed. As a result, after a period corresponding to the number of system frequency clocks which are obtained by adding the numbers of taps and stages of the filter bank 110 to each other has elapsed, a sample value re-sampled at the output sampling frequency is output in real time. For the embodiments of Tables 2 and 3, the fractional delay constant table 150 may be implemented using a specific amount of memory simply having four addresses.

Furthermore, two fractional delay constant tables 150 may be provided so that two or more output sampling frequencies can be converted into each other and used in real time. In the drawing, reference numeral 180 denotes a multiplexer which is configured to select one of two fractional delay constant tables. In this case, while any one fractional delay constant table 150 is being used, an external processor updates the content of the other one fractional delay constant table so that it can be suitable for the output sampling frequency to be used subsequently, thereby enabling conversion into the new output sampling frequency.

Meanwhile, an input sample is continuously written in the sample buffer 100 in synchronization with the input sampling frequency, and is read in synchronization with the system frequency. The number of samples written in the sample buffer 100 per time and the number of samples read may be calculated using the ratio L/M of the input sampling frequency Fs_i to the output sampling frequency Fs_o. Here, L and M are values when Fs_o/Fs_i is represented using an integral denominator and an integral numerator. For example, when Fs_o=100 MHz and Fs_i=61.44 MHz, L=625 and M=384. That is, during the time T during which 384 input samples enter, 625 output samples are calculated and exit.

However, since overflow or underflow may occur in the sample buffer 100 due to the frequency offset, there are required measurement and compensation means for preventing this and means for controlling the reading and writing operations of the sample buffer. In FIG. 4, reference numeral 160 denotes a sample buffer control unit that does this. This sample buffer control unit 160 may include a writing control unit 162, a reading control unit 164, and a rate tracking & sync detection unit 166.

First, the writing control unit 162 creates a write address and a write enable signal related to the sample buffer 100, creates a corresponding synchronization signal and then transfers the synchronization signal to the rate tracking & sync detection unit 166 when, for example, a preset number of (J) samples are input to the sample buffer 100, and creates 'increase by one' signal and then transfers the 'increase by one' signal to the rate tracking & sync detection unit 166 whenever M samples are input.

Thereafter, the rate tracking & sync detection unit 166 converts a synchronization signal, created by the writing control unit 162, into a trigger signal in the system frequency domain, and transfers the resulting signal to the reading control unit 164. Furthermore, the rate tracking & sync detection unit 166 receives an address counter value related to the sample buffer 100 from the reading control unit 164 and the writing control unit 162, updates the address counter value, and provides the address counter value to the external processor.

The reading control unit 164 starts to create a read address related to the sample buffer 100 using the trigger signal received from the rate tracking & sync detection unit 166, receives the sample interval information N of the fractional delay constant table 150, changes the read address of the sample buffer 100, and creates a read enable signal related to the sample buffer 100. Furthermore, when every L samples are read, a (−1) decrease signal is generated, and is then transferred to the rate tracking & sync detection unit 166.

In greater detail, even when the circuit is initialized and starts to be driven, an input sample may not enter, so that data cannot be unconditionally drawn from the sample buffer 100 and overflow or underflow may occur in the sample buffer 100 of predetermined size due to the difference between the input sampling frequency and the output sampling frequency. Therefore, the reading control unit 164 and the writing control unit 162 are required.

The writing control unit 162 activates an address counter, which increases by one whenever an input sample enters into the sample buffer 100, in synchronization with the input sampling frequency. This address counter becomes a write address related to the sample buffer 100. When the write address reaches a predetermined value J, the writing control unit 162 generates a synchronization signal indicating that J samples have entered. The synchronization signal is 0 at first, is converted into 1 when the write address reaches J, and is transferred to the system frequency domain in the future and acts as a trigger signal indicating that a reading operation may be started.

Thereafter, the reading control unit 164 finds the time at which the trigger signal is changed from 0 to 1, and performs the operation of reading a sample from the sample buffer 100. The frequency and reading location thereof are determined in real time based on the sample interval information N which is calculated using Fs_o/Fs_i (=L/M).

However, Fs_o/Fs_i (=L/M) is a theoretical value. Actually, due to the difference in the precision of the hardware of a signal generator, the sampling frequency has an offset, with the result that overflow or underflow may occur in the sample buffer 100. In order to detect this, the rate tracking & sync detection unit 166 detects the variation in the number of samples remaining in the sample buffer 100 in real time, that is, detects the differences between the numbers of samples input and output for a predetermined period of time and the previously calculated L and M, for example, constructs a counter, the value of which increases by one whenever M samples are written and decreases by one whenever L samples are read, in the sample buffer 100 and then checks whether the value of the counter is close to 0, increases in the (+) direction, or decreases in the (−) direction, and transfers information about the variation to the external processor in real time. Then, the external processor compensates for the relative frequency offset based on the above information and then updates the fractional delay constant table 150, thereby preventing overflow or underflow from occurring. Here, when the value of the counter is close to 0, the input/output sampling frequency and the relative offset are consistent with predetermined values. When the value of the counter increases in the (+) direction, the input sampling frequency is higher than the predetermined value or the output sampling frequency is lower than the predetermined value. When the value of the counter decreases in the (−) direction, the input sampling frequency is lower than the predetermined value or the output sampling frequency is higher than the predetermined value.

Meanwhile, when the input sampling frequency is identical to the system frequency, the range of possible output sampling frequencies is lower than the input sampling frequency (in this case, the system frequency), in which case an input sample directly enters into the filter bank 110 without passing through the sample buffer 100 and the reading and writing control units 164 and 162 of the buffer control unit 160.

The digital re-sampling apparatus using a fractional delay generator according to the present invention may be implemented using a field programmable gate array (FPGA) in a hardware manner.

The digital re-sampling apparatus using a fractional delay generator according to the present invention is not limited to the above-described embodiments, but a variety of modifications and variations are possible within the range which does not depart from the spirit of the present invention. For example, although not shown in the drawings, an interface may be provided such that an external processor can change the filter coefficients of the filter bank at any time.

The invention claimed is:

1. A digital re-sampling apparatus using a fractional delay generator, comprising:
    a sample buffer for temporarily storing an input sample in synchronization with an input sampling frequency;
    a sample buffer control unit for controlling writing and reading operations of the sample buffer;
    a filter bank for digitally filtering the input sample, and comprising multiple digital filters composed of multiple taps, as many as stages in the filter bank;
    a first delay bank for differentially delaying each output of the multiple digital filters in the filter bank based on a number of the stages;
    a fractional delay constant table for storing information on time for re-sampling of the input sample;
    a combiner bank for generating a re-sampled output for every re-sampling time through arithmetic operations performed with the output of the first delay bank and a fractional delay constant stored in the fractional delay constant table, and comprising combiners composed of combinations of adders and multipliers, as many as the stages; and
    a second delay bank for synchronizing outputs of the combiners and outputs of the fractional delay constant table and delaying outputs of the combiners and outputs of the fractional delay constant table so as to obtain sequential high-speed operation of the combiners in the combiner bank.

2. The digital re-sampling apparatus as set forth in claim 1, wherein the filter bank, the first delay bank, the combiner bank and the second delay bank operate in synchronization with a system frequency that is higher than the output sampling frequency.

3. The digital re-sampling apparatus as set forth in claim 1, further comprising an output valid signal generator for providing information about a valid sample when the system frequency is higher than the output sampling frequency.

4. The digital re-sampling apparatus as set forth in claim 1, wherein the fractional delay constant table comprises a ring buffer for storing fractional delay constants and sample interval information, each of fractional delay constants is determined by a ratio of the input sampling frequency to the output sampling frequency and is a decimal greater than or equal 0 and less than 1, and the sample interval information indicates information about an address of the sample buffer where a sample to be subsequently inputted to the filter bank has been stored.

5. The digital re-sampling apparatus as set forth in claim 1, wherein the fractional delay constant table comprises at least two fractional delay constant tables,
    further comprising a multiplexer for selecting one fractional delay constant table from among the two fractional delay constant tables.

6. The digital re-sampling apparatus as set forth in claim 1, wherein:
    the buffer control unit comprises a reading control unit, a rate tracking & sync detection unit, and a writing control unit;
    the writing control unit creates a write address and a write enable signal related to the sample buffer, when a preset number of samples are inputted to the sample buffer, creates a corresponding synchronization signal and then transfers the synchronization signal to the rate tracking & sync detection unit, and, whenever a preset number of samples are inputted, creates an 'increase by one' signal and then transfers the 'increase by one' signal to the rate tracking & sync detection unit;
    the rate tracking & sync detection unit converts the synchronization signal created by the writing control unit into a trigger signal in a system frequency domain and then transfers the resulting signal to the reading control unit, receives address counter values related to the sample buffer from the reading control unit and the writing control unit, determines whether overflow or underflow has occurred and then provides determination results to an external processor so that the overflow or underflow can be compensated for; and
    the reading control unit starts to create a read address related to the sample buffer using the trigger signal received from the rate tracking & sync detection unit, receives the sample interval information N from the fractional delay constant table, changes the read address of the sample buffer and then creates a read enable signal related to the sample buffer, and, whenever L number of samples are read, creates a 'decrease by one' signal and then transfers the 'decrease by one' signal to the rate tracking & sync detection unit.

7. The digital re-sampling apparatus as set forth in claim 6, wherein when the input sampling frequency is identical to the system frequency, the sample buffer, the reading control unit and the writing control unit are omitted.

8. The digital re-sampling apparatus as set forth in claim 2, wherein:
    the buffer control unit comprises a reading control unit, a rate tracking & sync detection unit, and a writing control unit;
    the writing control unit creates a write address and a write enable signal related to the sample buffer, when a preset number of samples are inputted to the sample buffer, creates a corresponding synchronization signal and then transfers the synchronization signal to the rate tracking & sync detection unit, and, whenever a preset number of samples are inputted, creates an 'increase by one' signal and then transfers the 'increase by one' signal to the rate tracking & sync detection unit;
    the rate tracking & sync detection unit converts the synchronization signal created by the writing control unit into a trigger signal in a system frequency domain and then transfers the resulting signal to the reading control unit, receives address counter values related to the sample buffer from the reading control unit and the writing control unit, determines whether overflow or underflow has occurred and then provides determination results to an external processor so that the overflow or underflow can be compensated for; and
    the reading control unit starts to create a read address related to the sample buffer using the trigger signal received from the rate tracking & sync detection unit, receives the sample interval information N from the fractional delay constant table, changes the read address of the sample buffer and then creates a read enable signal related to the sample buffer, and, whenever L number of samples are read, creates a 'decrease by one' signal and then transfers the 'decrease by one' signal to the rate tracking & sync detection unit.

9. The digital re-sampling apparatus as set forth in claim 8, wherein when the input sampling frequency is identical to the system frequency, the sample buffer, the reading control unit and the writing control unit are omitted.

10. The digital re-sampling apparatus as set forth in claim 3, wherein:
the buffer control unit comprises a reading control unit, a rate tracking & sync detection unit, and a writing control unit;
the writing control unit creates a write address and a write enable signal related to the sample buffer, when a preset number of samples are inputted to the sample buffer, creates a corresponding synchronization signal and then transfers the synchronization signal to the rate tracking & sync detection unit, and, whenever a preset number of samples are inputted, creates an 'increase by one' signal and then transfers the 'increase by one' signal to the rate tracking & sync detection unit;
the rate tracking & sync detection unit converts the synchronization signal created by the writing control unit into a trigger signal in a system frequency domain and then transfers the resulting signal to the reading control unit, receives address counter values related to the sample buffer from the reading control unit and the writing control unit, determines whether overflow or underflow has occurred and then provides determination results to an external processor so that the overflow or underflow can be compensated for; and
the reading control unit starts to create a read address related to the sample buffer using the trigger signal received from the rate tracking & sync detection unit, receives the sample interval information N from the fractional delay constant table, changes the read address of the sample buffer and then creates a read enable signal related to the sample buffer, and, whenever L number of samples are read, creates a 'decrease by one' signal and then transfers the 'decrease by one' signal to the rate tracking & sync detection unit.

11. The digital re-sampling apparatus as set forth in claim 10, wherein when the input sampling frequency is identical to the system frequency, the sample buffer, the reading control unit and the writing control unit are omitted.

12. The digital re-sampling apparatus as set forth in claim 4, wherein:
the buffer control unit comprises a reading control unit, a rate tracking & sync detection unit, and a writing control unit;
the writing control unit creates a write address and a write enable signal related to the sample buffer, when a preset number of samples are inputted to the sample buffer, creates a corresponding synchronization signal and then transfers the synchronization signal to the rate tracking & sync detection unit, and, whenever a preset number of samples are inputted, creates an 'increase by one' signal and then transfers the 'increase by one' signal to the rate tracking & sync detection unit;
the rate tracking & sync detection unit converts the synchronization signal created by the writing control unit into a trigger signal in a system frequency domain and then transfers the resulting signal to the reading control unit, receives address counter values related to the sample buffer from the reading control unit and the writing control unit, determines whether overflow or underflow has occurred and then provides determination results to an external processor so that the overflow or underflow can be compensated for; and
the reading control unit starts to create a read address related to the sample buffer using the trigger signal received from the rate tracking & sync detection unit, receives the sample interval information N from the fractional delay constant table, changes the read address of the sample buffer and then creates a read enable signal related to the sample buffer, and, whenever L number of samples are read, creates a 'decrease by one' signal and then transfers the 'decrease by one' signal to the rate tracking & sync detection unit.

13. The digital re-sampling apparatus as set forth in claim 12, wherein when the input sampling frequency is identical to the system frequency, the sample buffer, the reading control unit and the writing control unit are omitted.

14. The digital re-sampling apparatus as set forth in claim 5, wherein:
the buffer control unit comprises a reading control unit, a rate tracking & sync detection unit, and a writing control unit;
the writing control unit creates a write address and a write enable signal related to the sample buffer, when a preset number of samples are inputted to the sample buffer, creates a corresponding synchronization signal and then transfers the synchronization signal to the rate tracking & sync detection unit, and, whenever a preset number of samples are inputted, creates an 'increase by one' signal and then transfers the 'increase by one' signal to the rate tracking & sync detection unit;
the rate tracking & sync detection unit converts the synchronization signal created by the writing control unit into a trigger signal in a system frequency domain and then transfers the resulting signal to the reading control unit, receives address counter values related to the sample buffer from the reading control unit and the writing control unit, determines whether overflow or underflow has occurred and then provides determination results to an external processor so that the overflow or underflow can be compensated for; and
the reading control unit starts to create a read address related to the sample buffer using the trigger signal received from the rate tracking & sync detection unit, receives the sample interval information N from the fractional delay constant table, changes the read address of the sample buffer and then creates a read enable signal related to the sample buffer, and, whenever L number of samples are read, creates a 'decrease by one' signal and then transfers the 'decrease by one' signal to the rate tracking & sync detection unit.

15. The digital re-sampling apparatus as set forth in claim 14, wherein when the input sampling frequency is identical to the system frequency, the sample buffer, the reading control unit and the writing control unit are omitted.

* * * * *